US012613295B2

(12) United States Patent
Lee et al.

(10) Patent No.: US 12,613,295 B2
(45) Date of Patent: Apr. 28, 2026

(54) VERTICAL HALL SENSOR WITH INTEGRATED TRACE

(71) Applicant: Texas Instruments Incorporated, Dallas, TX (US)

(72) Inventors: Dok Won Lee, Mountain View, CA (US); Keith Green, McKinney, TX (US); Bret Dahl, McKinney, TX (US); Andrew Singh, Sachse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 75 days.

(21) Appl. No.: 18/643,251

(22) Filed: Apr. 23, 2024

(65) Prior Publication Data

US 2025/0327886 A1 Oct. 23, 2025

(51) Int. Cl.
| | |
|---|---|
| *G01R 33/07* | (2006.01) |
| *G01B 7/14* | (2006.01) |
| *G01B 7/30* | (2006.01) |
| *G01R 33/00* | (2006.01) |
| *G01R 33/02* | (2006.01) |
| *G01R 33/06* | (2006.01) |

(52) U.S. Cl.
CPC ........ *G01R 33/077* (2013.01); *G01R 33/0011* (2013.01)

(58) Field of Classification Search
CPC ........ G01R 33/00; G01R 33/02; G01R 33/06; G01R 33/07; G01B 7/14; G01B 7/30
See application file for complete search history.

(56) References Cited

U.S. PATENT DOCUMENTS

2021/0072327 A1* 3/2021 Bito ........................ G01R 33/07

* cited by examiner

*Primary Examiner* — Neel D Shah
(74) *Attorney, Agent, or Firm* — Xianghui Huang; Frank D. Cimino

(57) ABSTRACT

In described examples, an integrated circuit (IC) includes a magnetic concentrator, a vertical Hall sensor, and a trace. The vertical Hall sensor is configured to detect a magnetic field oriented in a first dimension parallel to a substrate surface, and is located near the magnetic concentrator. The trace has first and second legs each oriented in a second dimension that is perpendicular to the first dimension and parallel to the substrate surface. The first leg is connected to the second leg in series between first and second ends of the trace. The first leg is located near the magnetic concentrator and so that a line perpendicular to and intersecting the substrate surface and the magnetic concentrator intersects the first leg. The second leg is located near the vertical Hall sensor.

20 Claims, 10 Drawing Sheets

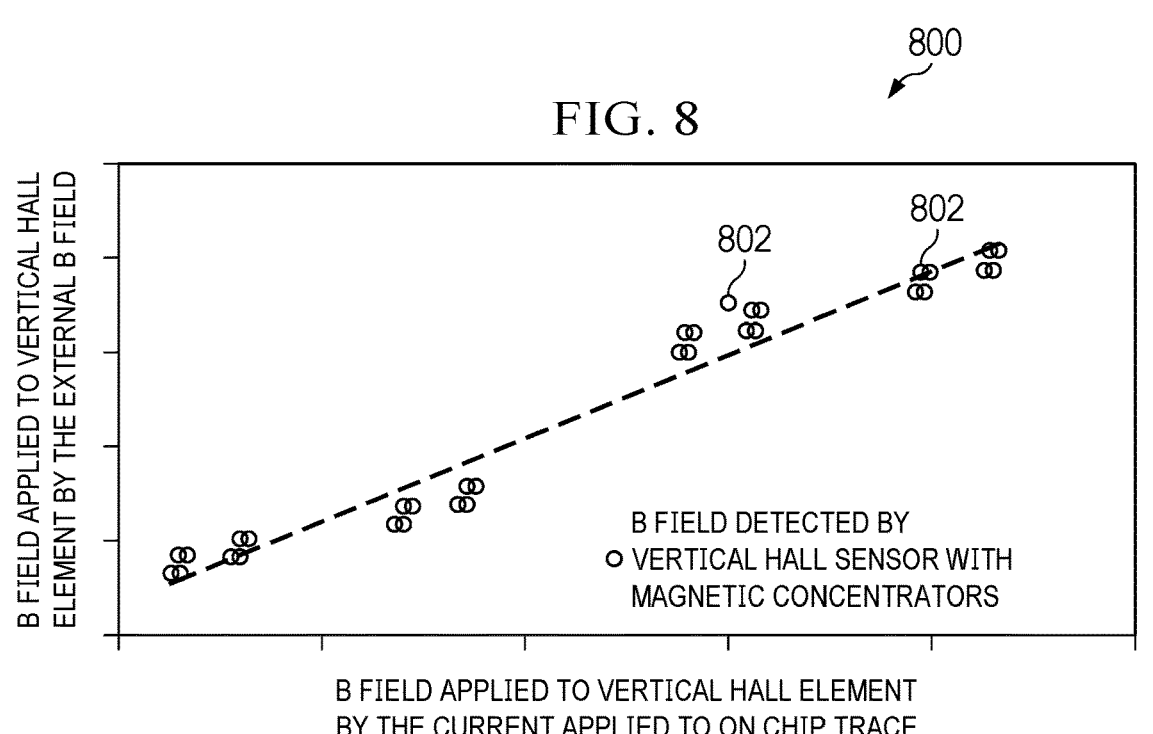

B FIELD DETECTED BY
o VERTICAL HALL SENSOR WITH
MAGNETIC CONCENTRATORS

B FIELD APPLIED TO VERTICAL HALL ELEMENT
BY THE CURRENT APPLIED TO ON CHIP TRACE

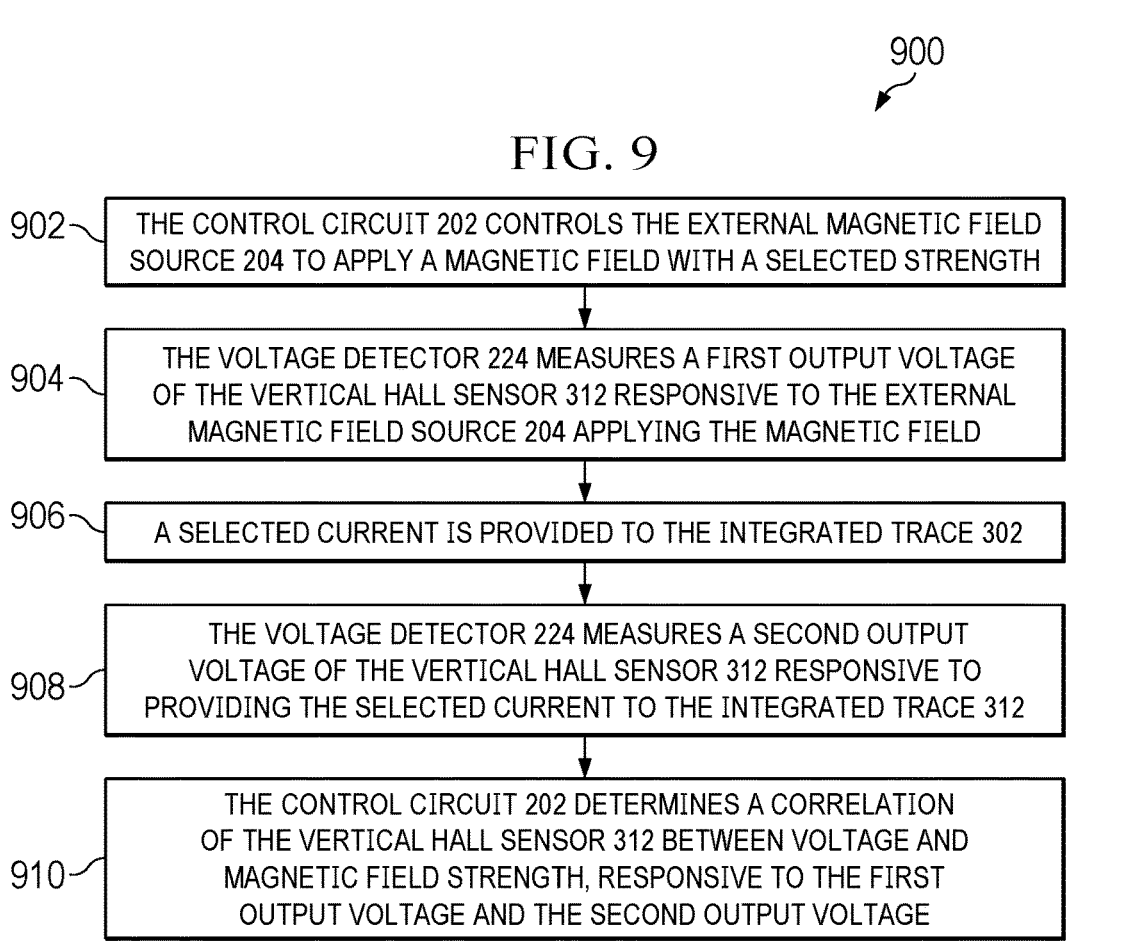

902 — THE CONTROL CIRCUIT 202 CONTROLS THE EXTERNAL MAGNETIC FIELD SOURCE 204 TO APPLY A MAGNETIC FIELD WITH A SELECTED STRENGTH

904 — THE VOLTAGE DETECTOR 224 MEASURES A FIRST OUTPUT VOLTAGE OF THE VERTICAL HALL SENSOR 312 RESPONSIVE TO THE EXTERNAL MAGNETIC FIELD SOURCE 204 APPLYING THE MAGNETIC FIELD

906 — A SELECTED CURRENT IS PROVIDED TO THE INTEGRATED TRACE 302

908 — THE VOLTAGE DETECTOR 224 MEASURES A SECOND OUTPUT VOLTAGE OF THE VERTICAL HALL SENSOR 312 RESPONSIVE TO PROVIDING THE SELECTED CURRENT TO THE INTEGRATED TRACE 312

910 — THE CONTROL CIRCUIT 202 DETERMINES A CORRELATION OF THE VERTICAL HALL SENSOR 312 BETWEEN VOLTAGE AND MAGNETIC FIELD STRENGTH, RESPONSIVE TO THE FIRST OUTPUT VOLTAGE AND THE SECOND OUTPUT VOLTAGE

VERTICAL HALL SENSOR WITH INTEGRATED TRACE

TECHNICAL FIELD

This application relates generally to magnetic field sensors, and more particularly to vertical Hall sensors with magnetic concentrators.

BACKGROUND

Hall effect sensors use a voltage caused by a Lorentz force exerted by a magnetic field (or B-field) on electrons in a current flowing through a conductor to detect and measure a component of the magnetic field that is perpendicular to the current flow. Hall effect sensors can provide benefits including some or all of high precision and accuracy, high sensitivity, high bandwidth, and/or wide output voltage range. This enables Hall effect sensors to be used in a wide variety of industrial and consumer applications, such as rotation angular speed sensing, position sensing, fluid flow sensing, current sensing, and pressure sensing.

SUMMARY

In described examples, an integrated circuit (IC) includes a magnetic concentrator, a vertical Hall sensor, and a trace. The vertical Hall sensor is configured to detect a magnetic field oriented in a first dimension parallel to a substrate surface, and is located near the magnetic concentrator. The trace has first and second legs each oriented in a second dimension that is perpendicular to the first dimension and parallel to the substrate surface. The first leg is connected to the second leg in series between first and second ends of the trace. The first leg is located near the magnetic concentrator and so that a line perpendicular to and intersecting the substrate surface and the magnetic concentrator intersects the first leg. The second leg is located near the vertical Hall sensor.

In described examples, a system includes a magnetic concentrator, a vertical Hall sensor, and a trace. The vertical Hall sensor is configured to detect a magnetic field oriented in a first dimension parallel to a substrate surface, and is located near the magnetic concentrator. The trace has first and second legs each oriented in a second dimension that is perpendicular to the first dimension and parallel to the substrate surface. The first leg is connected to the second leg in series between first and second ends of the trace. The first leg overlaps the magnetic concentrator. The second leg is located near the vertical Hall sensor.

BRIEF DESCRIPTION OF THE DRAWINGS

FIG. 8 is a graph of magnetic field strength produced by a fixed current through the integrated trace as detected by the vertical Hall sensor against magnetic field strength detected by the vertical Hall sensor in response to a fixed external magnetic field, in the first sensor system of FIGS. 3A and 3B.

FIG. 9 is a flow diagram of an example process for calibrating the vertical Hall sensor using the vertical Hall effect sensor system of FIG. 2.

DETAILED DESCRIPTION

Figure 1A:
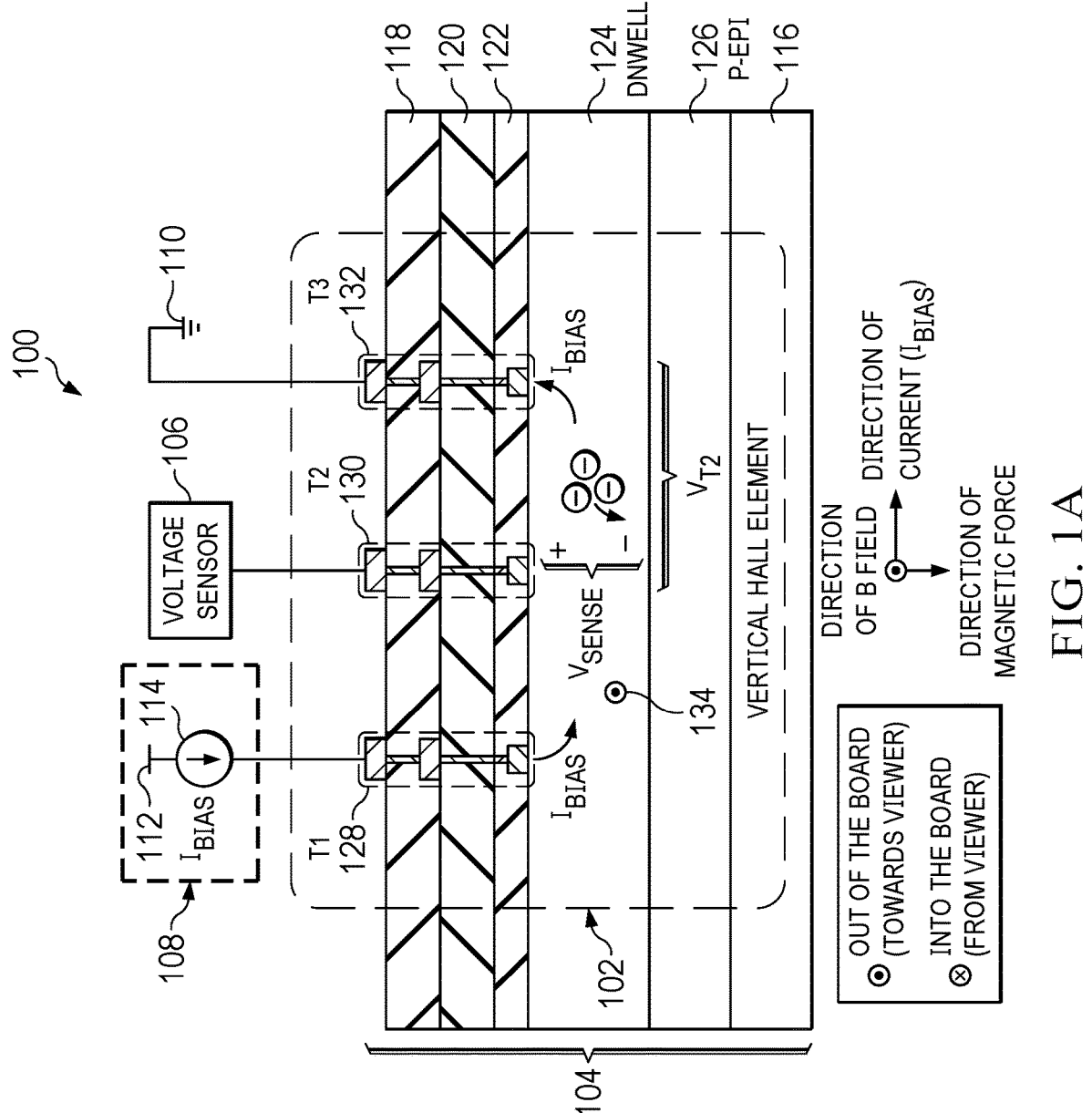
FIG. 1A is a cross-sectional circuit and functional block diagram of a first example vertical Hall effect sensor.

A vertical Hall effect sensor is so named in response to a sensed voltage that is oriented in a direction perpendicular to the surface of a substrate (or other workpiece) on which the vertical Hall effect sensor is fabricated. Accordingly, for a substrate with a major plane of cross-section oriented in a horizontal direction, the sensed voltage is oriented in a vertical direction. Herein, up refers to a direction perpendicular to a substrate surface, from a substrate body towards the substrate surface. Down refers to a direction perpendicular to the substrate surface, from the substrate surface to the substrate body. Vertical refers to the dimension described by the up and down directions. Horizontal refers to the dimension(s) perpendicular to the vertical dimension, accordingly, parallel to the substrate surface.

If a current flows through a conductor parallel to the surface of the substrate, and a magnetic field (or component of a magnetic field) is oriented parallel to the surface of the substrate and perpendicular to the direction of current flow, then the magnetic field will push electrons in the direction perpendicular to the surface of the substrate, accordingly generating the vertically-oriented voltage that the vertical Hall effect sensor senses. Accordingly, a vertical Hall effect sensor is able to detect a magnetic field (or a magnetic field component) that is oriented in a dimension perpendicular to the direction of current flow through the conductor. It is this perpendicular magnetic field component that exerts magnetic force on the electrons in the current flow to produce a voltage detectable by the vertical Hall sensor. This is illustrated in and further described with respect to FIGS. 1A and 1B. The current in the vertical Hall effect sensor that the magnetic field affects to thereby generate the sensed Hall voltage is referred to herein as detector current.

In some examples, an integrated trace refers to a metal or other conductive line fabricated on a substrate (or other workpiece) as part of a fabrication process of an integrated circuit (IC) that includes the integrated trace and a vertical Hall effect sensor located near the integrated trace. A magnetic concentrator (or magnetic flux concentrator) is a structure that focuses magnetic flux, provides additional magnetic flux, and emanates the concentrated magnetic field from a surface of the magnetic concentrator as a fringing magnetic field. A magnetic concentrator may be constructed using a soft magnetic material, such as a material with high permeability and low remanence. For example, Ni—Fe alloy, Ni, Fe, Co, and their binary and ternary alloys can be used to form a magnetic concentrator. Magnetic concentrators may include a single layer of magnetic material or multiple layers of different magnetic materials. Magnetic concentrators are further described with respect to FIG. 4.

An integrated trace with two magnetic concentrators can be fabricated so that current flows through the integrated trace in a first direction parallel to a substrate surface near (for example, under) a first magnetic concentrator, and in a second direction opposite the first direction and near (for example, over) the vertical Hall effect sensor between the two magnetic concentrators, and in the first direction near (for example, under) the second magnetic concentrator.

Herein, two components being near each other is defined as (depending on context) one component being sufficiently close to the other component to induce a designed magnetic field in the other component, or one component being sufficiently close to the other component to provide a designed sensing response to a magnetic field induced or emitted by the other component. Two components overlapping is defined as the components being located so that a line perpendicular to the substrate surface intersects both of the components. Two components partially overlapping is defined as the components being located so that they overlap and so that there exists, for each component, at least one line through the component and perpendicular to the substrate surface that does not intersect the other component. And two components fully (or completely) overlapping is defined as the components being located so that, for at least one of the two components, all lines through that component and perpendicular to the substrate surface intersect the other component.

In some examples, this current flow arrangement results in magnetic fields emanated by the first magnetic concentrator, the second magnetic concentrator, and the integrated trace that, at a location near the integrated trace and between the magnetic concentrators, are all oriented in the same direction and accordingly mutually reinforce each other. A first example arrangement of an integrated trace with two magnetic concentrators is S-shaped, as further described with respect to FIGS. 3A, 3B, and 5. A second example arrangement of an integrated trace with two magnetic concentrators is W-shaped, as further described with respect to FIG. 6. A third example arrangement of an integrated trace with a single magnetic concentrator is U-shaped, as further described with respect to FIG. 7.

In some examples, the reinforced magnetic field produced responsive to a selected level of current flow through the integrated trace is two times as strong as would be obtained using a straight integrated trace alone. The vertical Hall effect sensor can be located at this location of magnetic field reinforcement, enabling efficient production of a magnetic field detectible by the vertical Hall effect sensor. Further, the magnetic field detectible by the vertical Hall effect sensor is produced by and within the IC package that includes the vertical Hall effect sensor. This magnetic field is usable for applications such as test and calibration of the vertical Hall effect sensor.

Benefits of the integrated trace with magnetic concentrators arranged as described above can include some or all of a reduced current to generate a magnetic field having a selected strength, reduced device area to test and/or calibrate vertical Hall effect sensor function, reduced cost to test and/or calibrate vertical Hall effect sensor function, and/or reduced design complexity to test and/or calibrate vertical Hall effect sensor function.

The same reference numbers or other reference designators are used in the drawings to designate features that are related structurally and/or functionally.

FIG. 1A is a cross-sectional circuit and functional block diagram of a first example vertical Hall effect sensor 100. The vertical Hall effect sensor 100 includes a vertical Hall element 102 fabricated on a substrate 104, a voltage sensor 106, and a bias circuit 108. There is also a ground 110 shown. The bias circuit 108 includes a voltage source 112 and a current source 114. In some examples, the substrate 104 includes, and the vertical Hall element 102 is part of, an IC. Additional, different, and/or fewer layers and/or components can be used to fabricate a vertical Hall effect sensor such as the vertical Hall effect sensor 100.

In order from the surface of the substrate 104 to an unmodified portion of the substrate 104 (unmodified substrate 116), the substrate 104 includes a first layer 118, a second layer 120, a third layer 122, a deep n-type well (dnwell) 124, an epitaxial p-type layer (p-epi) 126, and the unmodified substrate 116. (Unmodified substrate 116 refers to a portion of the substrate 104 that has not had its chemical or physical structure deliberately modified by, for example, doping or etching.) A first contact and via assembly (T1, a first terminal) 128, a second contact and via assembly (T2) 130, and a third contact and via assembly (T3) 132 are fabricated to extend vertically from respective first ends at an interface between the third layer 122 and the dnwell 124, through the third, second, and first layers 122, 120, and 118, to respective second ends at the surface of the substrate 104.

The voltage source 112 is connected to a first terminal of the current source 114. The current source 114 provides a bias current $I_{BIAS}$ at its second terminal. The second terminal of the current source 114 is connected to the second end of T1 128 (at the surface of the substrate 104). An input of the voltage sensor 106 is connected to the second end of T2 130. The second end of T3 132 is connected to ground 110. T1 128, T2 130, and T3 132 are located so that T2 130 is between T1 128 and T3 132. Accordingly, current flows from the first end of T1 128, through the dnwell 124 and past the first end of T2 130, to the first end of T3 132.

Ampere's right hand rule and Fleming's left hand rule are useful herein. Into the board refers to a direction directly into the page. Out of the board refers to a direction directly out of the page.

Ampere's right hand rule applies when current flows through a conductor. If one points one's right thumb in the direction of current through the conductor and closes one's right hand fingers against the palm, the magnetic field induced by the current through the conductor will have magnetic lines of force in the direction in which the fingers close. For example, if a current is travelling into the board, the magnetic lines of force will be oriented clockwise around the conductor.

Fleming's left hand rule applies when a current-carrying conductor is located inside a magnetic field so that a magnetic force acts on the electrons in the conductor in a direction perpendicular to both the directions of the current and of the magnetic field (a magnetic field that is not perpendicular to the current can be divided into components parallel and perpendicular to the current to make this determination). In this case, point the left forefinger straight, extend the left thumb perpendicular to the left forefinger, and make the left middle finger perpendicular to the palm. The middle finger points in the direction of the current, the forefinger points in the direction of the magnetic field, and the thumb points in the direction of a magnetic force exerted by the magnetic field on the conductor, and accordingly, on the electrons travelling through the conductor.

When $I_{BIAS}$ is applied at T1 128, current flows from T1 128, through the dnwell 124, past T2 130, to T3 132. If a magnetic field (B field) 134 is applied in a direction out of the board (represented by a dot within a circle) (forefinger), then because current is flowing left to right parallel to the surface of the substrate 104 (middle finger), a magnetic force is exerted in the direction of the body of the substrate 104 (thumb downward). This magnetic force pushes electrons within the current (indicated by circled minus signs) towards the p-epi 126, so that there is a charge gradient, and accordingly an electric field, across the depth of the dnwell 124. The electric field corresponds to a Hall voltage across the depth of the dnwell 124. An illustration of this example application of the left hand rule is provided below the sensor element 104.

The production of this Hall voltage in response to applying a B field (such as the B field 134) to a current-carrying conductor (such as the dnwell 124) is referred to as the Hall effect. Accordingly, for a current and a magnetic field that are parallel to the surface of a substrate and perpendicular to each other, a vertically-oriented voltage is generated perpendicular to both the current and the magnetic field.

In some examples in which T2 130 is halfway between T1 128 and T3 132, a voltage ($V_{T2}$) at T2 130 when $I_{BIAS}$ is applied at T1 128, while the B field 134 is not applied, is half a voltage from T1 128 to T3 132. If $I_{BIAS}$ is applied at T1 128 and the B field 134 is applied, then the Hall effect results in a voltage $V_{SENSE}$ across the depth of the dnwell 124 near the first end of T2 130. The voltage sensor detects $V_{SENSE}$ and determines a difference between $V_{T2}$ and $V_{SENSE}$. A magnitude of a deviation of $V_{SENSE}$ from $V_{T2}$ is proportional to $I_{BIAS}$ and a magnitude of the B field 134. Accordingly, the difference between $V_{T2}$ and $V_{SENSE}$ equals a Hall voltage $V_{HALL}$ that indicates a magnitude of the B field 134 at the vertical Hall element 102.

Figure 1B:
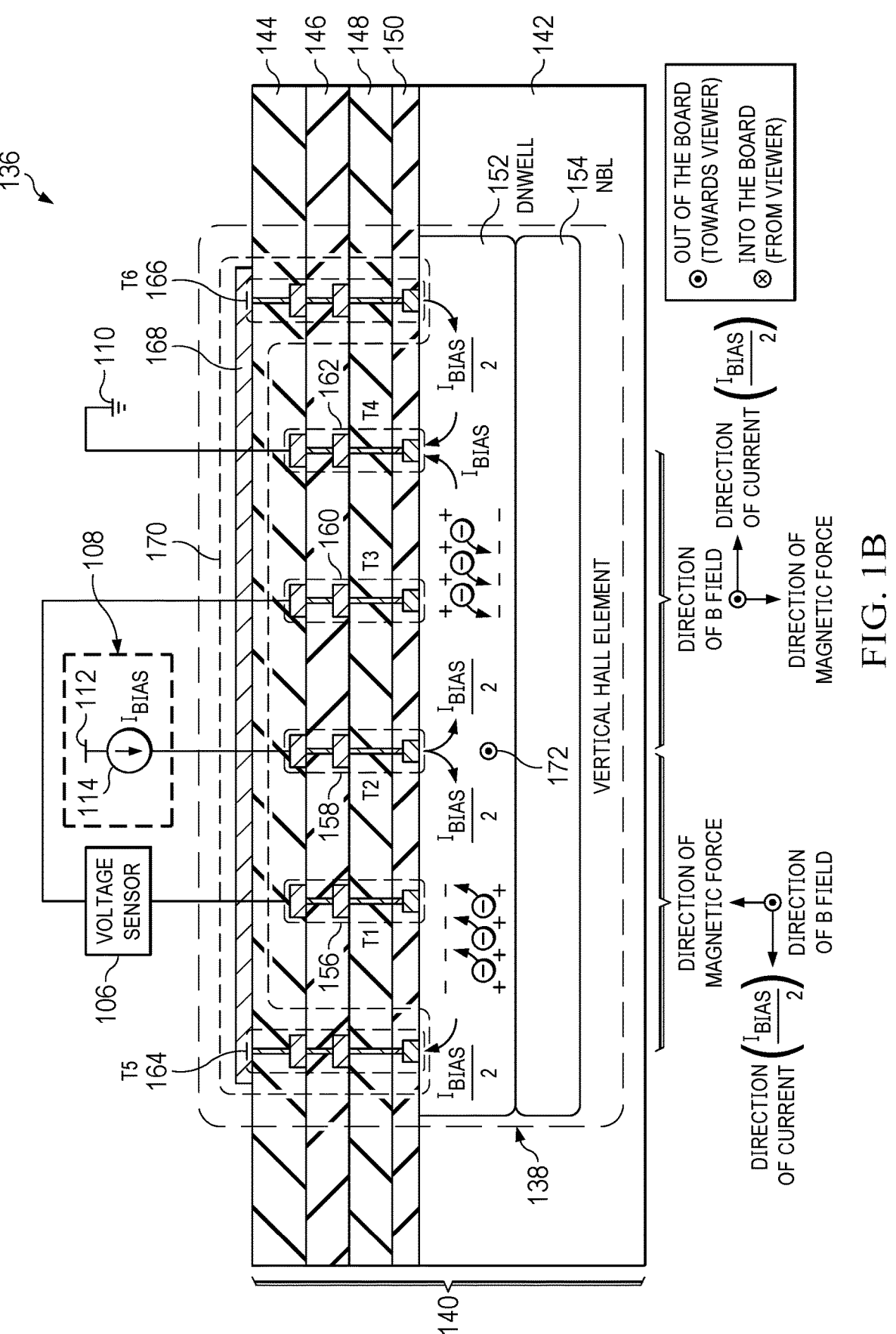
FIG. 1B is a cross-sectional circuit and functional block diagram of a second example vertical Hall effect sensor.

FIG. 1B is a cross-sectional circuit and functional block diagram of a second example vertical Hall effect sensor 136. The vertical Hall effect sensor 136 includes a vertical Hall element 138 fabricated on a substrate 140, a voltage sensor 106, and a bias circuit 108. There is also a ground 110 shown. The bias circuit 108 includes a voltage source 112 and a current source 114. In some examples, the substrate 140 includes, and the vertical Hall element 138 is part of, an IC. Additional, different, and/or fewer layers and/or components can be used to fabricate a vertical Hall effect sensor such as the vertical Hall effect sensor 136.

In order from the surface of the substrate 140 to an unmodified portion of the substrate 140 (unmodified substrate 142), the substrate 140 includes a first layer 144, a second layer 146, a third layer 148, a fourth layer 150, a deep n-type well (dnwell) 152, an n-type buried layer (NBL) 154, and the unmodified substrate 142. A first contact and via assembly (T1, a first terminal) 156, a second contact and via assembly (T2) 158, a third contact and via assembly (T3) 160, and a fourth contact and via assembly (T4) 162 are fabricated to run vertically from respective first ends at an interface between the fourth layer 150 and the dnwell 152, through the third, second, and first layers 148, 146, and 144, to respective second ends at an interface between the first layer 144 and the second layer 146.

A fifth contact and via assembly (T5) 164 and a sixth contact and via assembly (T6) 166 are fabricated to extend vertically from respective first ends at an interface between the fourth layer 150 and the dnwell 152, through the third, second, and first layers 148, 146, and 144, to the surface of the substrate 140. A conductive connector 168 is fabricated on the surface of the substrate 140, so that it is connected at a first end to T5 164, and is connected at a second end to T6 166. Together, the T5 164, T6 166, and the conductive connector 168 form an alternative current path 170. In some examples, connections of T1 156, T2 158, T3 160, and T4 162 are arranged so that one or more terminals (T1 156, T2 158, T3 160, or T4 162) providing current and one or more terminals (T1 156, T2 158, T3 160, or T4 162) performing voltage sensing alternate or otherwise switch functions over the course of a voltage sensing cycle.

When $I_{BIAS}$ is applied at T2 158, current flows along two paths. A first current path runs from T2 158, through the dnwell 152, past T3 160, to T4 162. A second current path runs from T2 158, through the dnwell 152, past T1 156, from the first end of T5 164 through the alternative current path 170 to the first end of T6 166, through the dnwell 152, to T4 162. (The alternative current path 170 and the second current path are different; the former is part of the latter.) In some examples, current is evenly split between the first and second current paths, so that $I_{BIAS}/2$ flows through the first current path, and $I_{BIAS}/2$ flows through the second current path.

Illustration of an example application of the left hand rule to the first current path and second current path is provided below the Hall sensor element 138. An illustrated example application of the left hand rule to the first current path is provided on the right, and an example application of the left hand rule to the second current path is provided on the left. These examples are further described below.

A Hall voltage generated in the first current path is oriented in an opposite direction from a Hall voltage generated in the second current path. As an example, this result is described with respect to a magnetic field 172 applied in a direction out of the board (forefinger). In the first current path, current flows left to right parallel to the surface of the substrate 140 (middle finger), so that a magnetic force is exerted in the direction of the body of the substrate 140 (thumb downward). This magnetic force pushes electrons within the current (indicated by circled minus signs) towards the NBL 154, so that there is a charge gradient, and accordingly an electric field, across the depth of the dnwell 152. Accordingly, there is a greater positive charge near the first end of T3 160, and a greater negative charge deeper in the dnwell 152, further from the first end of T3 160.

Description with respect to the second current path continues with the example in which the magnetic field 172 is applied in the direction out of the board (forefinger). In the second current path, current flows (for a portion of the current path from T2 158 to T5 164) right to left parallel to the surface of the substrate 104 (middle finger), so that a magnetic force is exerted in the direction of the surface of the substrate 140 (thumb upward). This magnetic force pushes electrons within the current (indicated by circled minus signs) towards the surface of the substrate 140, so that there is a charge gradient, and accordingly an electric field, across the depth of the dnwell 152. Accordingly, there is a greater negative charge near the first end of T1 156, and a greater positive charge deeper in the dnwell 152, further from the first end of T1 156.

Accordingly, there is a voltage between a first end of T1 156 and a first end of T3 160 that is responsive to the respective vertical Hall voltages established near T1 156 and T3 160, and that is horizontal. In some examples, benefits of measuring this horizontal voltage include one or more of simpler design and improved accuracy. In some examples, a horizontal voltage responsive to one or more Hall voltages can be generated and measured using different circuit and/or functional block layout than described herein.

Figure 2:
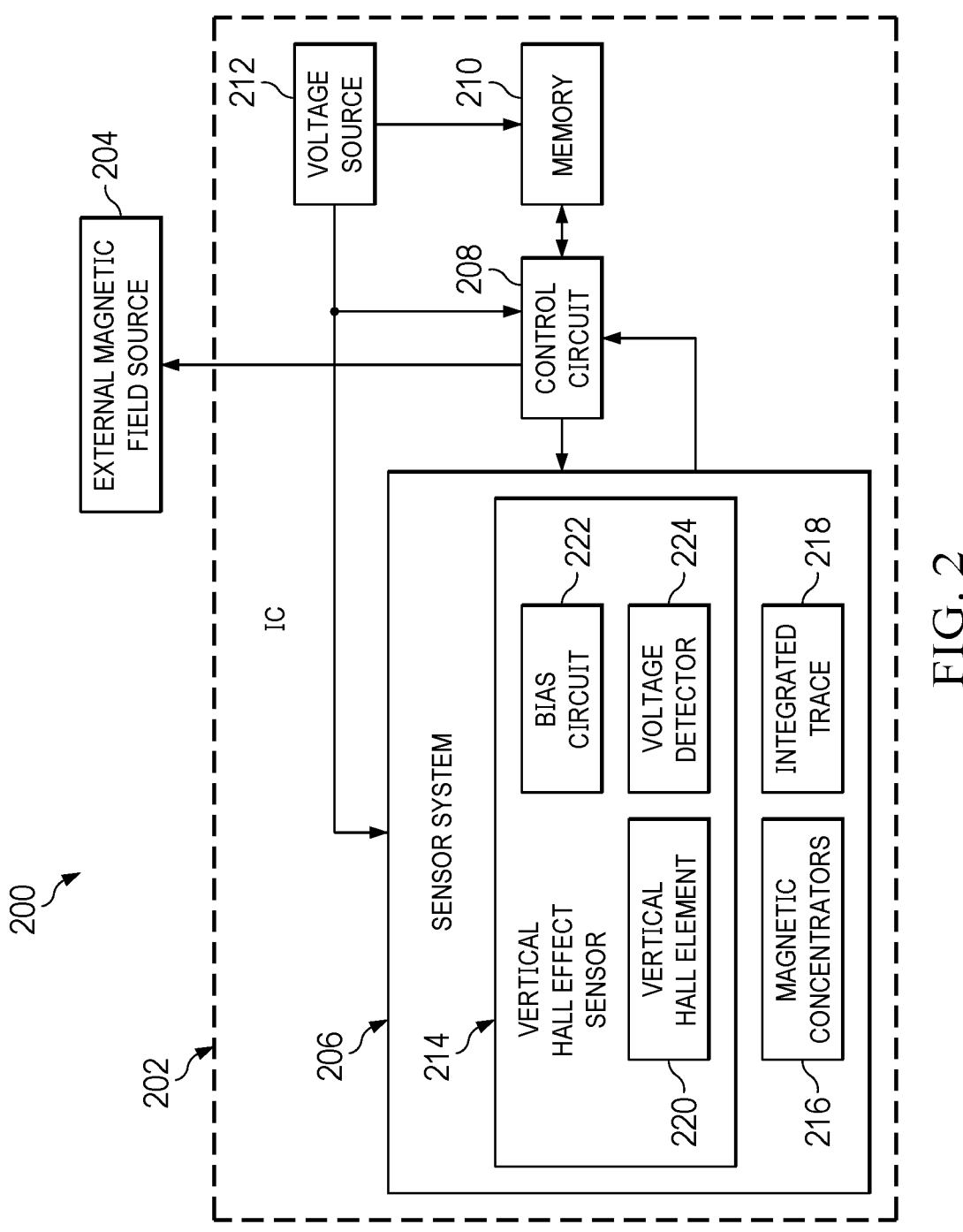
FIG. 2 is a functional block diagram of an example vertical Hall effect sensor system including an integrated trace.

FIG. 2 is a functional block diagram of an example vertical Hall effect sensor system 200 including an integrated trace. The vertical Hall effect sensor system 200 includes an IC 202 and an external magnetic field source 204. The IC 202 includes a sensor system 206, a control circuit 208, a memory 210, and a voltage source 212. The sensor system 206 includes a vertical hall effect sensor 214, one or more magnetic concentrators 216, and an integrated trace 218. The integrated trace 218 is further described below with respect to FIGS. 3A through 7. The vertical Hall sensor 214 includes a vertical Hall element 220, a bias circuit 222, and a voltage detector 224.

The voltage source 212 is connected to power the sensor system 206, the control circuit 208, and the memory 210. The control circuit is connected to control the sensor system 206 and the memory 210. The vertical Hall sensor 214 senses a magnetic field responsive to the magnetic concentrators 216, and provides voltage information from the voltage detector 224 to the control circuit 208. The control circuit 208 controls the external magnetic field source 204 or the integrated trace 218 to generate a magnetic field to be sensed by the vertical Hall sensor 214. Accordingly, the control circuit 208 controls the bias circuit 222 to selectably connect to the vertical Hall sensor 214 to provide a bias current to the conductive line of the vertical Hall sensor 214. Providing the bias current to the conductive line of the vertical Hall sensor enables magnetic field sensing by the vertical Hall sensor 214.

Figure 3A:
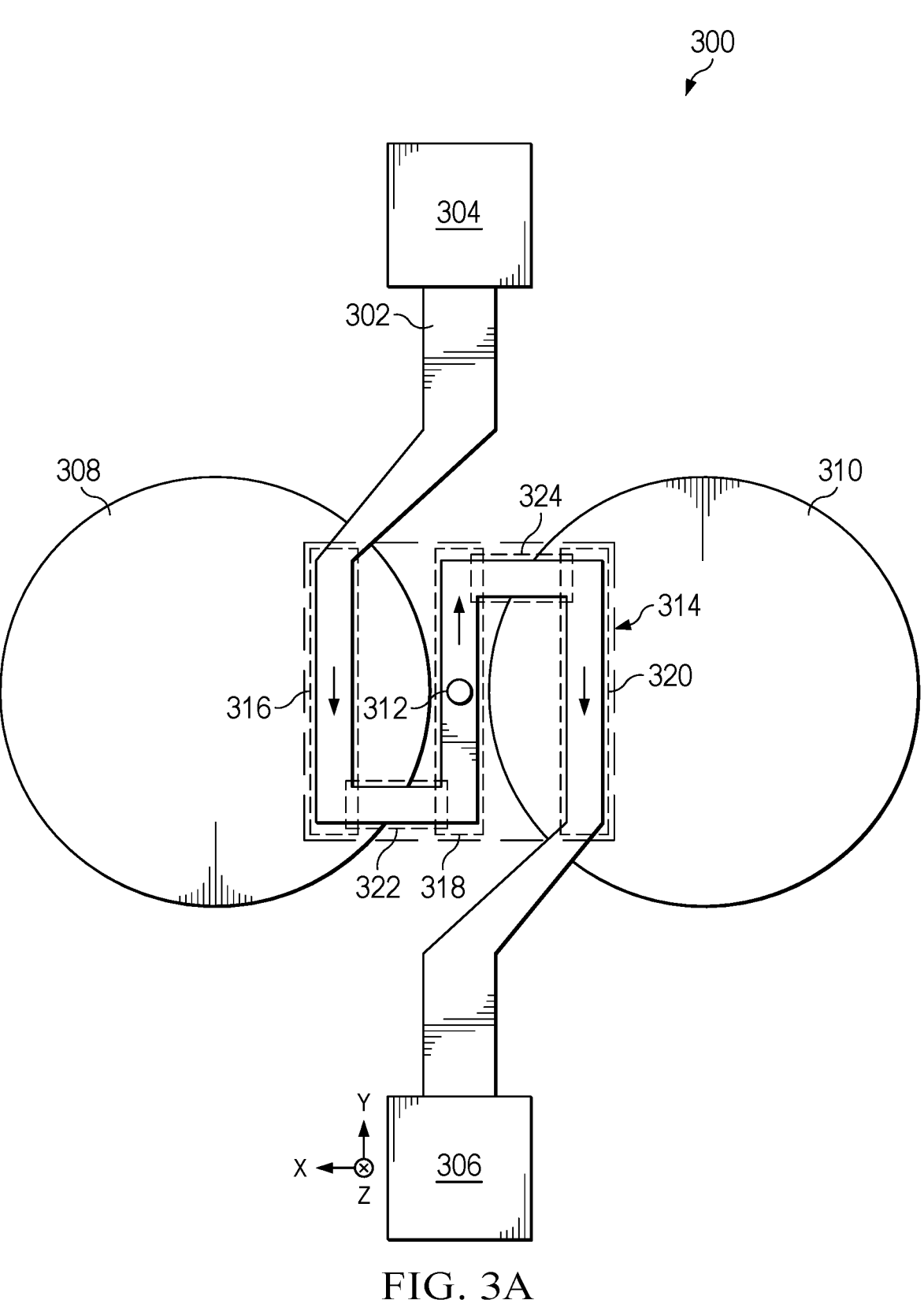
FIG. 3A is a bottom-up view of a first example sensor system including an integrated trace.
Figure 3B:
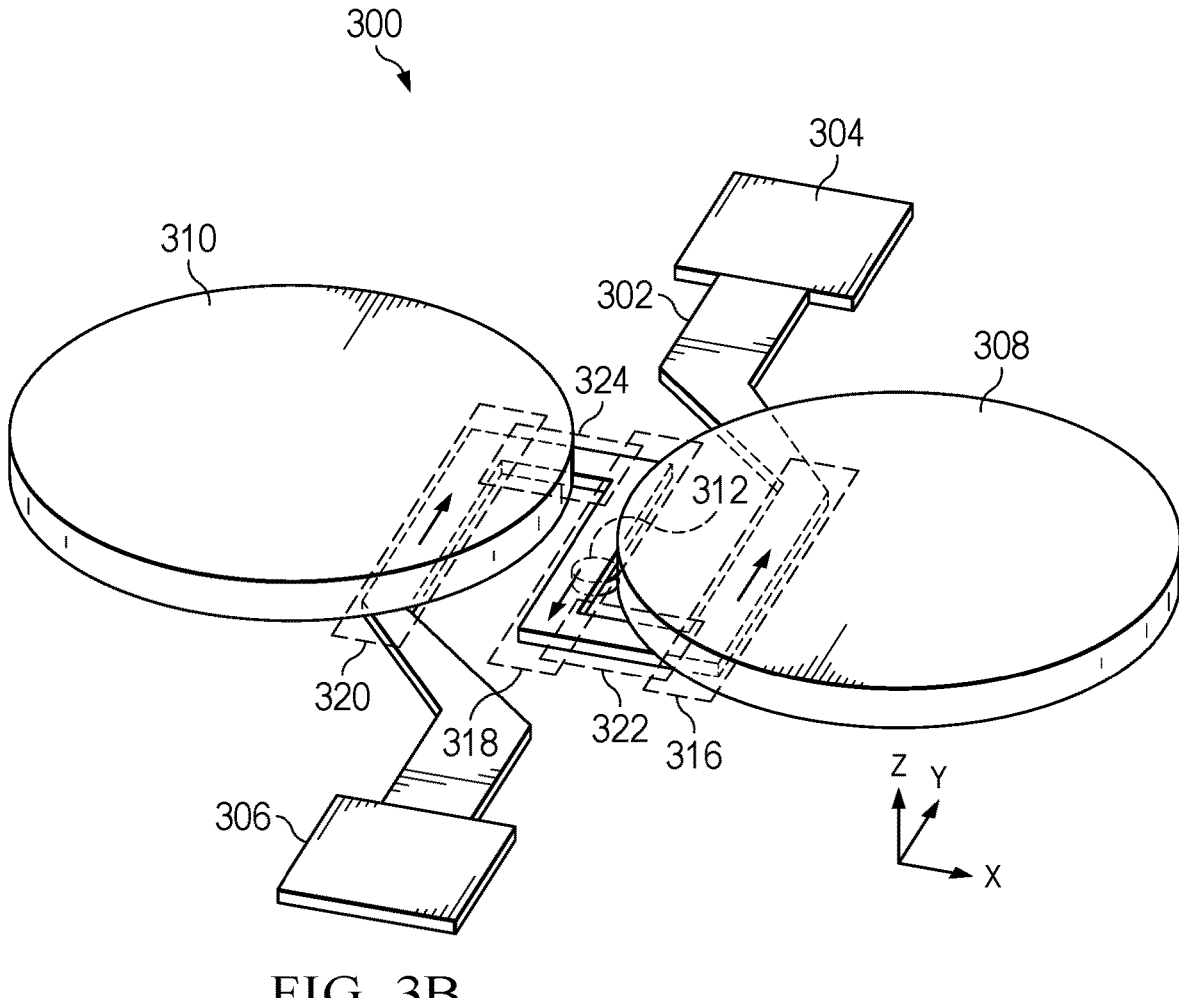
FIG. 3B is a top perspective view of the first example sensor system of FIG. 3A.

FIG. 3A is a bottom-up view of a first example sensor system 300 including an integrated trace. FIG. 3B is a top perspective view of the first example sensor system 300 of FIG. 3A. Components of the sensor system 300 are fabricated on an IC or other substrate. X-Y-Z arrows provide orientation with respect to the substrate surface in 3A and later figures. X and Y lie parallel to the substrate surface, and the Z arrow points upwards, out of and perpendicularly to the substrate surface. The sensor system 300 includes an integrated trace 302, a first contact pad 304, a second contact pad 306, a first magnetic concentrator 308, a second magnetic concentrator 310, and a vertical Hall sensor 312.

In some examples, the magnetic concentrators 308 and 310 are fabricated on a semiconductor wafer or other semiconductor workpiece as part of a same fabrication process used to manufacture the integrated trace 302 and the vertical Hall sensor 312. In some examples, the magnetic concentrators 308 and 310 are fabricated in the package using pick-and-place on a top surface of the IC. In some examples, the first contact pad 304 and/or the second contact pad 306 is replaced by vias and/or one or more switches connecting the integrated trace 302 to a voltage source at a first end of the integrated trace 302 and to a ground at a second end of the integrated trace 302.

The integrated trace 302 is fabricated parallel to a plane of the substrate surface, is connected to the first contact pad 304 at a first end, and is connected to the second contact pad 306 at a second end. The magnetic concentrators 308 and 310 in the sensor system 300 are fabricated so that respective cross-sections (taken in the X-Y plane) of the magnetic concentrators 308 and 310 are circular. They are, for example, disc-shaped. In some examples, magnetic concentrators used with the integrated trace 302 and the vertical Hall sensor 312 are a different shape, such as an octagon, a star, an ellipse, or a rectangle. An example vertical Hall effect sensor system using octagonal magnetic concentrators is further described with respect to FIG. 6.

Figure 4A:
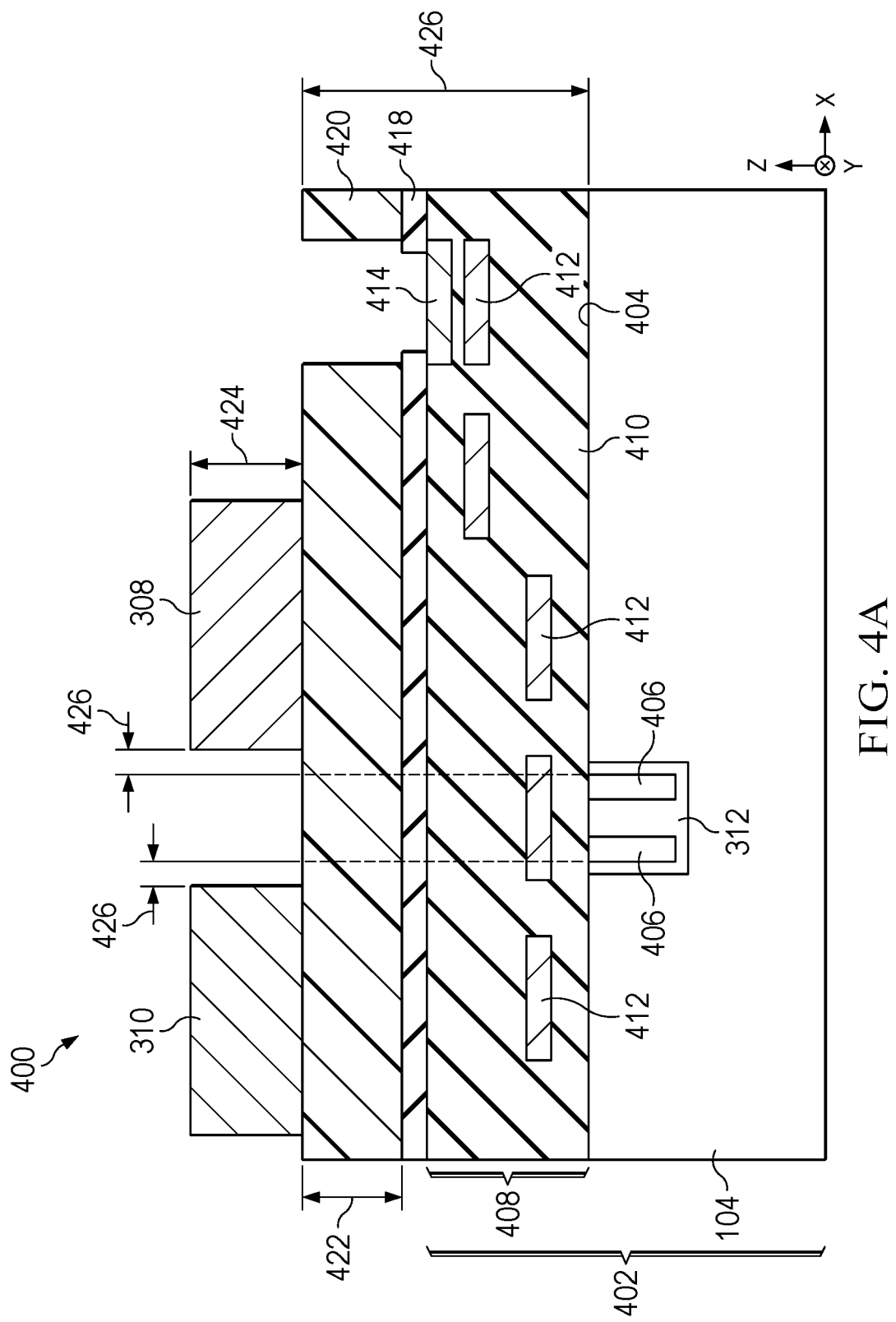
FIG. 4A is a first cross-sectional view of the sensor system of FIGS. 3A and 3B.

The magnetic concentrators 308 and 310 are fabricated so that a radius of each of the magnetic concentrators 308 and 310 is parallel to a surface of a substrate that includes the sensor system 300. The magnetic concentrators 308 and 310 are located so that they do not overlap and so that there is a horizontal spacing (gap) between them. In some examples, a relatively shorter gap between the magnetic concentrators 308 and 310 correlates to a fringing field between the magnetic concentrators 308 and 310 having increased strength. In some examples, such as examples corresponding to magnetic concentrators fabricated on a wafer, a length of a gap between magnetic concentrators 308 and 310 approximately equals a thickness of the magnetic concentrators 308 and 310. Thickness of a magnetic concentrator is the size of the magnetic concentrator in a direction perpendicular to the substrate surface 404 (FIG. 4A). In some examples, the magnetic concentrators 308 and 310 have thickness between 10 and 50 micrometers ($\mu m$), and are between 10 and 50 $\mu m$ apart.

In some examples, a relatively shorter gap between the magnetic concentrators 308 and 310 correlates to an increased strength of a fringing field of the magnetic concentrators 308 and 310. In some examples, a reduction in distance between the magnetic concentrators 308 and 310 is limited by a process used to fabricate the magnetic concentrators. Herein, a length of a gap between the magnetic concentrators 308 and 310 being "approximately" equal to a thickness of the magnetic concentrators 308 and 310 is defined as a design range of the gap between the magnetic concentrators 308 and 310 being equal to or less than a design range of the thickness of the magnetic concentrators 308 and 310.

The vertical Hall sensor 312 is fabricated between the magnetic concentrators 308 and 310, and on a plane parallel to the substrate surface that does not intersect the magnetic concentrators 308 and 310. The vertical Hall sensor 312 is located and oriented so that a direction of fringing field detectable by the vertical Hall sensor 312 is parallel to the substrate surface. In some examples, the vertical Hall sensor 312 is located and oriented so that a direction of magnetic field detectable by the vertical Hall sensor 312 is parallel to a component of the magnetic field emitted by the magnetic concentrators 308 and 310 that is parallel to the substrate surface and that intersects the vertical Hall sensor 312. An example of this arrangement is shown in and further described with respect to FIG. 4.

In some examples, the vertical Hall sensor 312 is located between and does not overlap the magnetic concentrators 308 and 310. In some examples, locating the vertical Hall sensor 312 symmetrically between the magnetic concentrators 308 and 310 improves a uniformity of the fringing field as it intersects the vertical Hall sensor 312. Alternatively, in some examples, the vertical Hall sensor 312 overlaps, such as partially overlaps, one of the magnetic concentrators 308 or 310. In some examples, the vertical Hall sensor 312 fully overlaps one of the magnetic concentrators 308 or 310.

The integrated trace 302 can be fabricated on a metal layer that is vertically between layers that include the vertical Hall sensor 312 and layers that include the magnetic concentrators 308 and 310. In some examples, respective sizes and relative vertical and horizontal distances of the integrated trace 302, the magnetic concentrators 308 and 310, and the vertical Hall sensor 312 are responsive to routing design and a magnetic field sensitivity of the sensor system 300.

In an example, at least portions of the vertical Hall sensor 312 are fabricated using semiconductor doping. The integrated trace 302 is fabricated on the substrate surface above the vertical Hall sensor 312 or on a workpiece surface. In some examples, the integrated trace 302 is fabricated after additional layers have been deposited on the substrate surface. The magnetic concentrators 308 and 310 are fabricated or placed on top of one or more layers deposited over a metal layer that includes the integrated trace 302.

The integrated trace 302 includes three parallel portions or segments (also referred to herein as "legs") that together form a field reinforcing region 314: a first leg 316, a second leg 318, and a third leg 320. The first leg 316, the second leg 318, and the third leg 320 are parallel to each other, and are coupled in series from the first contact pad 304 (at a first end of the integrated trace 302), to the first leg 316, to the second leg 318, to the third leg 320, to the second contact pad 306 (at a second end of the integrated trace 302). The first, second, and third legs 316, 318, and 320 are coupled so that current runs through the first leg 316 in a first direction, current runs through the second leg 318 in a second direction opposite to the first direction, and current runs through the third leg 320 in the first direction. Arrows are used to indicate example directions of current through the first, second, and third legs 316, 318, and 320. A first portion 322 of the integrated trace 302 connects the first leg 316 to the second leg 318, and a second portion 324 of the integrated trace 302 connects the second leg 318 to the third leg 320. In some examples, the first, second, and third legs 316, 318, and 320 have a same width.

The first leg 316 is located so that a plane intersecting and perpendicular to the surface of the substrate and intersecting the first magnetic concentrator 308 includes a length of the first leg 316. The second leg 318 is located between the first leg 316 and the third leg 320 and between the first and second magnetic concentrators 308 and 310, so that a plane intersecting and perpendicular to the surface of the substrate and intersecting the second leg 318 does not include either of the magnetic concentrators 308 or 310. The third leg 320 is located so that a plane intersecting and perpendicular to the surface of the substrate and intersecting the second magnetic concentrator 310 includes a length of the third leg 320.

In other words, the first magnetic concentrator 308 overlaps the first leg 316 and is non-overlapping with the second and third legs 318 and 320. Also, the second magnetic concentrator 310 overlaps the third leg 320 and is non-overlapping with the first and second legs 316 and 318. In some examples, the first magnetic concentrator 308 and/or the second magnetic concentrator 310 partially overlaps the second leg 318. In some examples, the second leg 318 overlaps the vertical Hall sensor 312.

Arrows within the three legs 316, 318, and 320 indicate example current flow directions in response to a voltage source coupled to the first contact pad 304 and a ground coupled to the second contact pad 306. In some examples, current can be applied through the integrated trace 302 a direction opposite to that indicated by the arrows. Magnetic fields generated by or responsive to current flow within the three legs 316, 318, and 320 are further described with respect to FIG. 4.

FIG. 4A is a first cross-sectional view 400 of the sensor system 300 of FIGS. 3A and 3B. The sensor system 300 is fabricated as or as part of an integrated circuit on a semiconductor die 402 that includes a semiconductor substrate 104 with a substrate surface 404.

The semiconductor substrate 104 includes a vertical Hall sensor 312, and the vertical Hall sensor 312 includes multiple active sensor sub-elements 406. Although not illustrated, the vertical Hall sensor 312 may include non-active, or dummy, sensor sub-elements, such as at lateral boundaries of the vertical Hall sensor 312. In some examples, the dummy sensor sub-elements are not electrically connected to the active sensor sub-elements 406. In some examples, signals output by the dummy sensor sub-elements are not included, or scaled with a lower weight, in the magnetic field measurement output by the sensor system 300.

The semiconductor substrate 104 may be or include a bulk semiconductor substrate, a semiconductor-on-insulator (SOI) substrate, or other semiconductor substrate. In some examples, the semiconductor substrate 104 includes one or more epitaxial layers epitaxially grown on an underlying substrate. In some examples, the semiconductor substrate 104 is or includes a bulk silicon substrate, such as a bulk silicon substrate singulated from a wafer. In some examples, a bulk silicon substrate includes one or more silicon epitaxial layers epitaxially grown on the bulk silicon substrate.

In some examples, the vertical Hall sensor 312 includes four active sub-elements 406 or a different number of active sensor sub-elements 406. While example vertical Hall sensors 312 are described above, any type or configuration of vertical Hall sensor 312 may be implemented.

The semiconductor die 102 further includes an interconnect structure 408 on or over the semiconductor substrate 104. The interconnect structure 408 includes one or more dielectric layers 410 and one or more interconnect metal layers 412 embedded in or surrounded by the dielectric layer(s) 410. The integrated trace 302 is fabricated in an interconnect metal layer 412.

The one or more dielectric layers 410 may include a pre-metal dielectric (PMD) layer, one or more inter-metal dielectric (IMD) layers, one or more etch stop layers (ESLs), the like, or a combination thereof. Each dielectric layer 410 may be or include any dielectric to provide electrical insulation or reduced electrical conductivity, such as silicon oxide, borophosphosilicate glass (BPSG), phosphosilicate glass (PSG), silicon nitride, silicon oxynitride, silicon oxycarbon nitride, silicon oxycarbide, or the like.

Each interconnect metal layer 412 may include metal contacts, metal vias, and/or metal lines. The top-most interconnect metal layer 412 of the interconnect structure 408 includes a metal external connector bond pad 414. The metal external connector bond pad 414 of the top-most interconnect metal layer 412 may be configured to have attached thereto an external connector, such as a wire by wire bonding.

Each interconnect metal layer 412 may include one or more barrier and/or adhesion layers and a fill metal on the one or more barrier and/or adhesion layers. In some examples, an interconnect metal layer 412 includes one or more metal contacts, metal vias, metal lines, and/or metal bond pads therein. In some examples, a barrier and/or adhesion layer includes one or more of titanium nitride (TiN), tantalum nitride (TaN), the like, or a combination thereof. In some examples, a fill metal includes one or more of tungsten (W), copper (Cu), aluminum (Al), the like, or a combination thereof. The interconnect metal layers 412 may interconnect various devices formed in and/or on the semiconductor substrate 104, including the vertical Hall sensor 312.

The semiconductor die 402 also includes a protective dielectric layer 418 over the interconnect structure 408. More specifically, the protective dielectric layer 418 is over the interconnect metal layer 412 that includes the metal external connector bond pad 414. In an example, the metal external connector bond pad 414 is included in a top-most interconnect metal layer 412 of the interconnect structure 408. An opening through the protective dielectric layer 418 exposes the metal external connector bond pad 414. The protective dielectric layer 418 may be or include various dielectric materials, such as silicon oxide, silicon nitride, silicon oxynitride, or the like.

The packaged sensor system 300 includes a polymer layer 420 over the protective dielectric layer 418. An opening through the polymer layer 420 corresponds with and aligns with the opening through the protective dielectric layer 418 that exposes the metal external connector bond pad 414. In some examples, the polymer layer 420 is polyimide or the like. The polymer layer 420 has a thickness 422. Here, thickness 422 refers to a size of the polymer layer 420 in a direction perpendicular to the substrate surface 404. In some examples, the thickness 422 of the polymer layer 420 is equal to or greater than 3 μm, such as in a range from 3 μm to 15 μm. In some examples, the polymer layer 420 is omitted.

The magnetic concentrators 308 and 310 are over and supported by a same surface of the semiconductor die 402, accordingly, they are on a same side of the semiconductor die 402. In the example illustrated by FIG. 4A, the magnetic concentrators 308 and 310 are over or on the polymer layer 420. In some other examples, such as when the polymer layer 420 is omitted, the magnetic concentrators 308 and 310 are over or on the protective dielectric layer 418.

As described above, the magnetic concentrators 308 and 310 include a magnetic material. In some examples, the magnetic concentrators each include one or more of cobalt, nickel, iron, a binary alloy thereof such as nickel iron (NiFe) alloy, and/or a ternary alloy thereof. In some examples, each magnetic concentrator 308 and 310 includes a single layer of magnetic material. In some examples, one or both magnetic concentrators 308 and 310 includes layers of different magnetic materials.

The magnetic concentrators 308 and 310 are arranged with the interconnect structure 408, the protective dielectric layer 418, and the polymer layer 420 vertically between the vertical Hall sensor 312 and the magnetic concentrators 308 and 310. In this context, vertical refers to a Z direction, accordingly, a direction perpendicular to the substrate surface 404.

As described above, the magnetic concentrators 308 and 310 have a thickness 424 (size), such as in a direction perpendicular to the substrate surface 404. A distance 426 is a Z direction component of a distance between the vertical Hall sensor 312 (in some examples, the substrate surface 404) and the magnetic concentrators 308 and 310. In some examples, the distance 426 equals the sum of the thicknesses of the interconnect structure 408, the protective dielectric layer 418, and, if present, the polymer layer 420. In some examples, the distance 426 is equal to or greater than 5 μm, such as in a range from 5 μm to 100 μm.

In the example illustrated by FIG. 4A, each of the magnetic concentrators 308 and 310 is laterally offset from a nearest boundary of a respective nearest active sensor sub-element 406 of the vertical Hall sensor 312 by a distance 428. In some examples, the boundary of an active sensor sub-element 406 of the vertical Hall sensor 106 is an edge of an isolation region, such as a shallow trench isolation, that defines the active sensor sub-element 406 in the semiconductor substrate 104.

As described above, neither of the magnetic concentrators overlap with the vertical Hall sensor 312. In some examples, a component overlapping a vertical Hall sensor 312 refers to the component overlapping a region within a boundary of the vertical Hall sensor 312. When one or more dummy sensor sub-elements are present in the vertical Hall sensor 312, the magnetic concentrators 308 and 310 may overlap, at least partially, respective dummy sensor sub-elements. In some examples, one or both of the magnetic concentrators 308 and/or 310 has a sidewall that vertically aligns with a respective nearest boundary of a respective nearest active sensor sub-element 406 of the vertical Hall sensor 312. In some examples, one or both the magnetic concentrators 308 and/or 310 has a portion that vertically overlaps a respective portion of an active sensor sub-element 406 of the vertical Hall sensor 312.

Figure 4B:
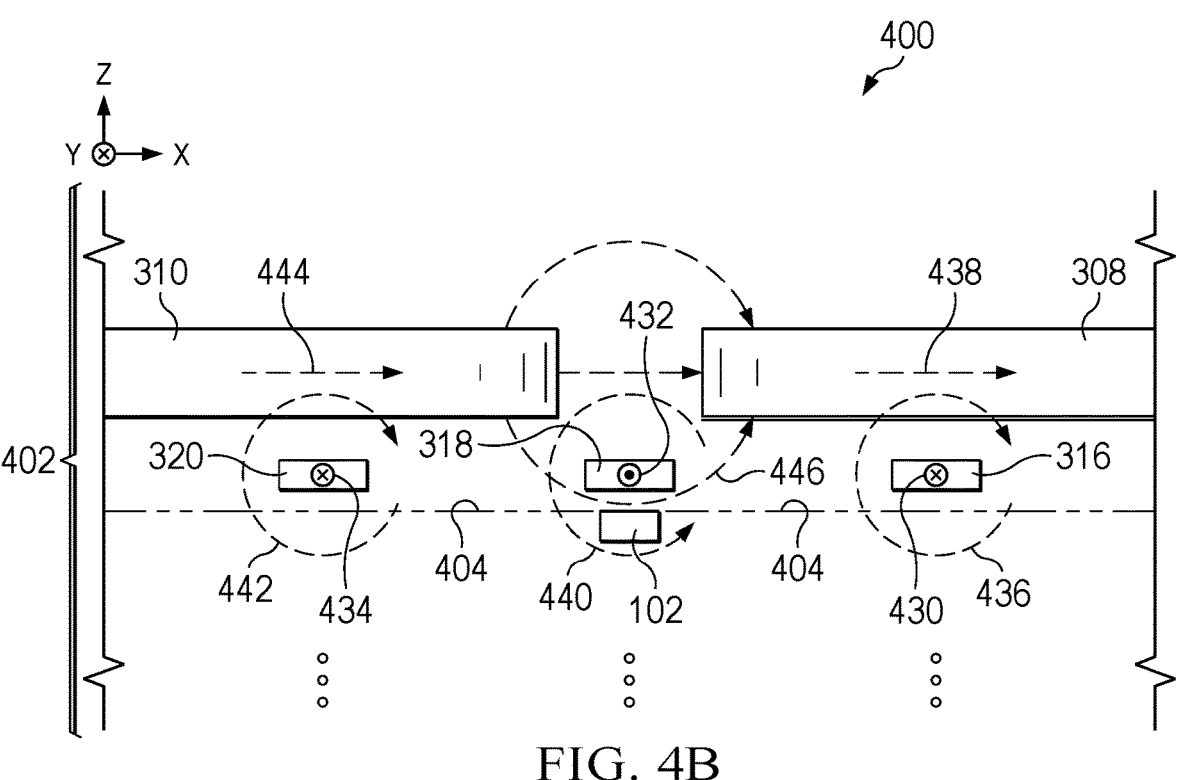
FIG. 4B is a second cross-sectional view of the sensor system of FIGS. 3A and 3B.

FIG. 4B is a second cross-sectional view 428 of the sensor system 300 of FIGS. 3A and 3B. The substrate surface 404 is represented by dotted lines that are located in a Z direction between the vertical Hall sensor 312 and the first, second, and third legs 316, 318, and 320. For clarity, these dotted lines do not extend across the width of FIG. 4A.

Current 430 through the first leg 316 flows into the board. Current 432 through the second leg 318 flows out of the board. Current 434 through the third leg 320 flows into the board. In some examples, current flows through the integrated trace 302 in an opposite direction. Major axes of the first and second magnetic concentrators 308 and 310 refer to respective long axes as shown in FIG. 4B.

According to the right hand rule, the current 430 through the first leg 316 generates a first magnetic field 436 oriented clockwise around the first leg 316. The first magnetic field 436 induces a second magnetic field 438 within the first magnetic concentrator 308. Within the first magnetic concentrator 308, the second magnetic field 438 is perpendicular to the first leg 316 and parallel to the major axis of the first magnetic concentrator 308.

The current 432 through the second leg 318 generates a third magnetic field 440 that is oriented counter-clockwise around the second leg 318. Where the third magnetic field 440 intersects the vertical Hall sensor 312, the third magnetic field 440 is generally parallel to the substrate surface 404.

The current 434 through the third leg 320 generates a fourth magnetic field 442 oriented clockwise around the third leg 320. The fourth magnetic field 418 induces a fifth magnetic field 444 within the second magnetic concentrator 310. Within the second magnetic concentrator 310, the fifth magnetic field 444 is perpendicular to the third leg 320 and parallel to the major axis of the second magnetic concentrator 310.

Due to fringe effects, the first and second magnetic concentrators 308 and 310 together generate a sixth magnetic field 446 that intersects the vertical Hall sensor 312. Because the second and fifth magnetic fields 438 and 444 are both oriented from left to right, they reinforce each other in generating the sixth magnetic field 446. Accordingly, the first magnetic concentrator 308 provides a source for the magnetic field lines of the sixth magnetic field 446, and the second magnetic concentrator 310 provides a sink for the magnetic field lines of the sixth magnetic field 446. Note that these magnetic field line source and sink roles would reverse if current were provided through the integrated trace 302 in an opposite direction. Note also that the first and fourth magnetic fields 436 and 442, generated by the first and third legs 316 and 320 respectively, are oriented from left to right where they intersect the magnetic concentrators 308 and 310, and the sixth magnetic field 446 is oriented from left to right where it intersects the vertical Hall sensor 312.

Where the sixth magnetic field 446 intersects the vertical Hall sensor 312, the sixth magnetic field 446 is generally parallel to the substrate surface 404. Because both the third and sixth magnetic fields 440 and 446 are oriented from left to right at the vertical Hall sensor 312, they reinforce each other, strengthening the signal received by the vertical Hall sensor 312 responsive to the current through the integrated trace 302. Accordingly, the first and second magnetic concentrators 308 and 310 change orientations of the first and fourth magnetic fields 436 and 442 from being mutually destructive to being mutually reinforcing with respect to the third magnetic field 440. Recall that the first and fourth magnetic fields 436 and 442 are respectively generated by the first and third legs 316 and 320, and the third magnetic field 440 is generated by the second leg 318.

Figure 5:
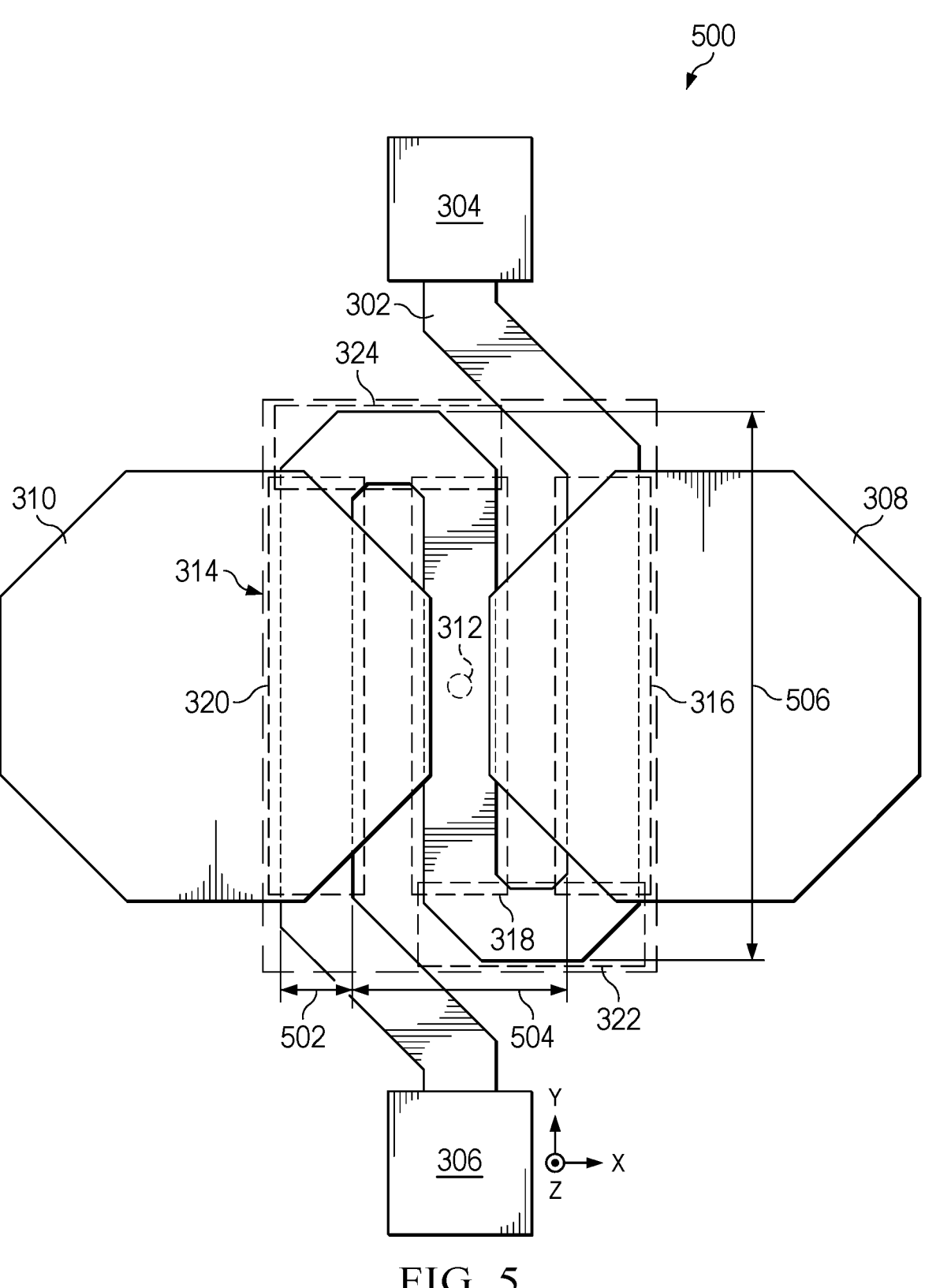
FIG. 5 is a top-down view of a second example sensor system including an integrated trace.

FIG. 5 is a top-down view of a second example sensor system 500 including an integrated trace. The second sensor system 500 is similar to the first sensor system 300. The magnetic concentrators 308 and 310 are regular octagons. Also, relative dimensions of the field reinforcing region 314 of the integrated trace 302 with respect to other features of the second sensor system 500 are different than in the first sensor system 300. For example, the first and third legs 316 and 320 extend further towards edges of respective overlapping magnetic concentrators 308 and 310, so that some (or all) of respective connecting portions 322 and 324 are located beyond the boundaries of respective magnetic concentrators 308 and 310. Accordingly, the first and third legs 316 are longer with respect to a respective size of the magnetic concentrators 308 and 310.

Design parameters affecting performance of the integrated trace 302 with magnetic concentrators 308 and 310 to generate a magnetic field for detection by the vertical Hall sensor 312 include a trace width 502, a trace spacing 504, a trace length 506, a trace electrical resistance, a current needed to generate a selected benchmark magnetic field strength, a maximum current density, a magnetic field variation across multiple Hall plates (conductive lines on which the Hall voltage is generated) of the vertical Hall sensor 312, and a correlation to magnetic gain. Correlation to magnetic gain relates to correlation between sensitivity of the vertical Hall sensor 312 to magnetic fields generated and induced by the integrated trace 302, and sensitivity of the vertical Hall sensor 312 to magnetic fields generated by external magnetic field sources. This correlation is further discussed with respect to FIG. 8. In some examples, the second leg 318 is spaced symmetrically between the first 316 and third legs 320. In some examples, leg spacing is asymmetrical.

Trace width 502 corresponds to the width of an individual leg 316, 318, or 320. Trace spacing 504 corresponds to a nearest distance from the first leg 316 to the third leg 320. Trace length 506 corresponds to the length of an individual legs 316, 318, or 320. In some examples, longer trace length 506 corresponds to increased magnetic field uniformity at the vertical Hall sensor 312. In some examples, device design parameters are selected in response to a device area budget, a routing area budget, or a minimum sensitivity of the vertical Hall sensor 312.

In an example, a width of the integrated trace 302 is between 10 and 50 micrometers (μm), a spacing between nearest edges of the first leg 316 and the third leg 320 is between 50 and 300 μm, a length of the field reinforcing region 314 is between 100 and 500 μm, a resistance of the integrated trace 302 is less than one Ohm (Ω), a current through the integrated trace 302 is between 100 and 300 milliamperes (mA), and a resulting magnetic field strength detected by the vertical Hall sensor 112 is between 1 and 5 millitesla (mT).

Figure 6:
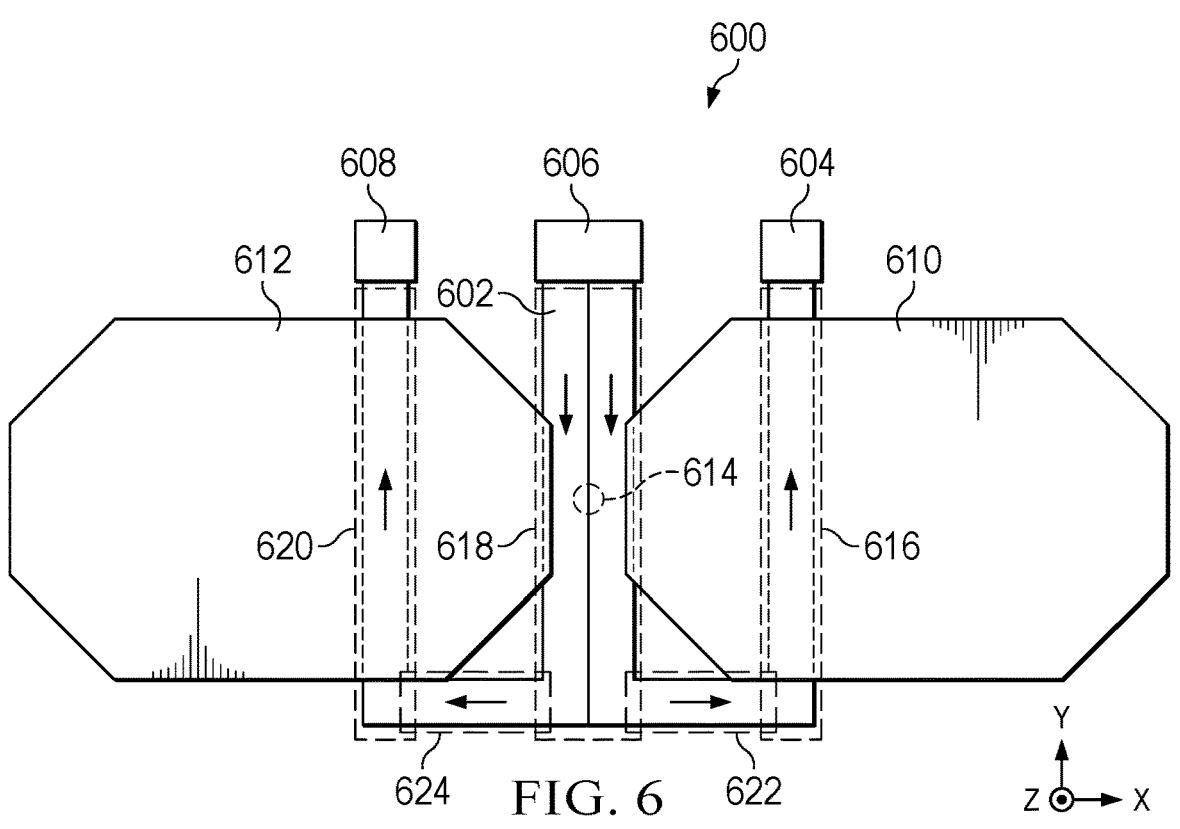
FIG. 6 is a top-down view of a third example sensor system including an integrated trace.

FIG. 6 is a top-down view of a third example sensor system 600 including an integrated trace. The third sensor system 600 includes an integrated trace 602, a first contact pad 604, a second contact pad 606, a third contact pad 608, a first magnetic concentrator 610, a second magnetic concentrator 612, and a vertical Hall sensor 614. The first and second magnetic concentrators 610 and 612 have octagonal horizontal cross-sections. The integrated trace 602 includes a first leg 616, a second leg 618, a third leg 620, a first intermediate portion 622, and a second intermediate portion 624.

The first, second, and third legs 616, 618, and 620 are parallel to each other and perpendicular to the first and second intermediate portions 622 and 624. The first contact pad 604 is connected to the first leg 616, which runs under the first magnetic concentrator 610. The first leg 616 is connected to the second leg 618 by the first intermediate portion 622, and the second leg 618 is connected to the third leg 620 by the second intermediate portion 624. The second leg 618 is connected to the second contact pad 606, and the third leg 620 is connected to the third contact pad 608. The second leg 618 runs between and partially beneath the first and second magnetic concentrators 610 and 612, and the third leg 620 runs beneath the second magnetic concentrator 612. Together, the first, second, and third legs 616, 618, and 620 and the first and second intermediate portions 622 and 624 form a W-shape. The vertical Hall sensor 614 is located between the first and second magnetic concentrators 612 and 614 and beneath the second leg 618.

In an example, the second contact pad 606 is connected to a voltage source, and the first and third contact pads 604 and 608 are connected to ground, so that current flows through the second leg 618 to the first and third legs 616 and 620. Accordingly, the integrated trace 602 generates and induces magnetic fields similar to those described with respect to the first sensor system 300 in FIG. 4.

Figure 7:
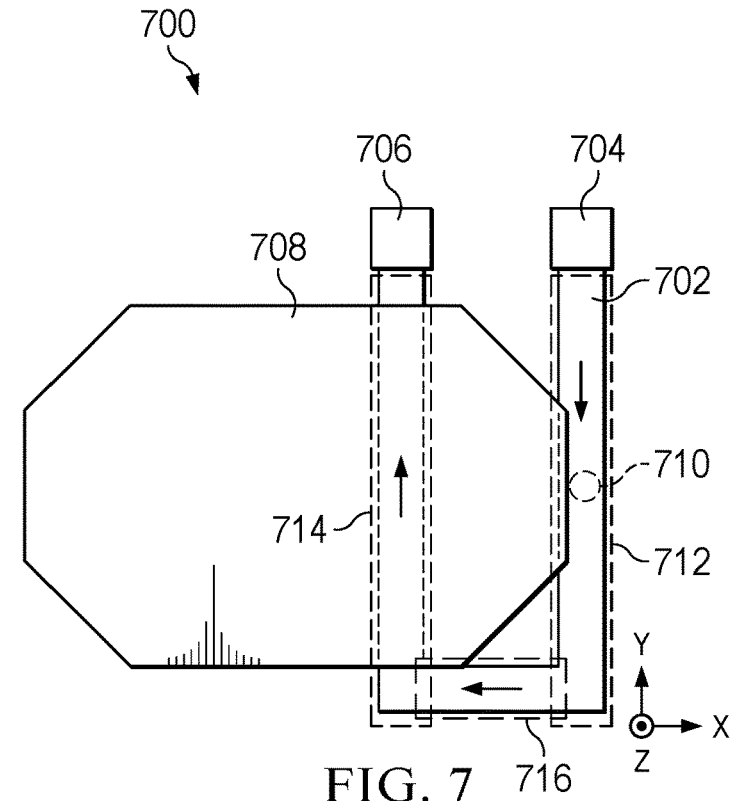
FIG. 7 is a top-down view of a fourth example sensor system including an integrated trace.

FIG. 7 is a top-down view of a fourth example sensor system 700 including an integrated trace. The fourth sensor system 700 includes an integrated trace 702, a first contact pad 704, a second contact pad 706, a magnetic concentrator 708, and a vertical Hall sensor 710. The magnetic concentrator 708 has an octagonal horizontal cross-section. The integrated trace 702 includes a first leg 712, a second leg 714, and an intermediate portion 716.

The first and second legs 712 and 714 are parallel to each other and perpendicular to the intermediate portion 716. The first contact pad 704 is connected to the first leg 712, and the second contact pad 706 is connected to the second leg 714. The first leg 712 is connected to the second leg 714 via the intermediate portion 716. The vertical Hall sensor 710 is located near the magnetic concentrator 708. The first leg 712 overlaps and lies above the vertical Hall sensor 710, and runs near the magnetic concentrator 708 in a direction tangential to an axis (such as a major axis or radius) of the magnetic concentrator 708. The second leg 714 runs beneath (overlapping) the magnetic concentrator 708.

In an example, the first contact pad 704 is connected to a voltage source, and the second contact pad 706 is connected to ground, so that current flows through the first leg 712 to the second leg 714. Accordingly, the integrated trace 702 generates and induces magnetic fields similar to those described with respect to the first and second legs 316 and 318 of the first sensor system 300 in FIG. 4.

FIG. 8 is a graph 800 of magnetic field strength produced by a fixed current through the integrated trace 302 as detected by the vertical Hall sensor 312 against magnetic field strength detected by the vertical Hall sensor 312 in response to a fixed external magnetic field, in the first sensor system 300 of FIGS. 3A and 3B. Accordingly, a horizontal axis corresponds to a field strength of an internal (on-chip), localized magnetic field, and a vertical axis corresponds to a field strength of an external, uniform magnetic field.

Different data points 802 correspond to different combinations of length, width, mutual spacing, and other variable device design parameters for the integrated trace 302, magnetic concentrators 308 and 310, and vertical Hall sensor 312.

The high degree of correlation between horizontal and vertical coordinates indicates a high degree of correlation between sensitivity of the vertical Hall sensor 312 to magnetic fields generated and induced by the integrated trace 302, and sensitivity of the vertical Hall sensor 312 to magnetic fields generated by external magnetic field sources, such as sources of uniform magnetic fields. Accordingly, in some examples, the first example sensor system 300 provides high accuracy across process variation.

FIG. 9 is a flow diagram of an example process 900 for calibrating the vertical Hall sensor 312 using the vertical Hall effect sensor system 200 of FIG. 2. In block 902, the control circuit 202 controls the external magnetic field source 204 to apply a magnetic field with a selected strength. In block 904, the voltage detector 224 measures a first output voltage of the vertical Hall sensor 312 responsive to the external magnetic field source 204 applying the magnetic field. In block 906, a selected current is provided to the integrated trace 302. In block 908, the voltage detector 224 measures a second output voltage of the vertical Hall sensor 312 responsive to providing the selected current to the integrated trace 312. In block 910, the control circuit 202 determines a correlation of the vertical Hall sensor 312 between voltage and magnetic field strength, responsive to the first output voltage and the second output voltage.

In some examples, one or more of the first leg 316, the second leg 318, and the third leg 320 are straight lines. In some examples, one or more of the first leg 316, the second leg 318, and the third leg 320 are curved lines. In some examples, a leg shape is designed responsively to a selected magnetic field shape.

In some examples, one or more pairs of the first leg 316 and/or the second leg 318 and/or and the third leg 320 are not parallel. In some examples, one or more pairs of the first leg 316 and/or the second leg 318 and/or and the third leg 320 are sufficiently oriented in a same direction to induce magnetic fields that meet a design requirement for mutual reinforcement. In some examples, orientation of a leg in a direction corresponds to orientation of the leg with respect to a first horizontal dimension and a second horizontal dimension, so that the first and second horizontal dimensions are perpendicular to each other.

In some examples, a leg shown as mostly non-overlapping a magnetic concentrator, such as the second leg 318 in the sensor system 500 of FIG. 5, the second leg 610 in the sensor system 600 of FIG. 6, or the first leg 710 in the sensor system 700 of FIG. 7, does not overlap the magnetic concentrator.

In some examples, a first leg corresponds to a first trace connected to a voltage source at a first end and to a ground at a second end so that current flows in a first direction, a second leg corresponds to a second trace connected to a voltage source at a first end and to a ground at a second end so that current flows in a second direction opposite the first direction, and a third leg corresponds to a third trace connected to a voltage source at a first end and to a ground at a second end so that current flows in the first direction.

In some examples, a first leg 316 or a third leg 320 intersects a line that intersects and is perpendicular to the surface of the substrate, and that intersects a center of a respective magnetic concentrator 308 or 310.

In some examples, a magnetic field applied at a center of a magnetic concentrator, rather than closer to a rim of the magnetic concentrator, increases the strength of a magnetic field induced within the magnetic field; and accordingly, a strength of a magnetic field emitted by the magnetic concentrator.

In some examples, location of first and third legs 316 and 320 is responsive to routing considerations with respect to design of other circuits of the IC.

In some examples, an external magnetic field source 204 is controlled by a control circuit other than a control circuit 208 that is on an IC 202 with a Hall effect sensor system 206. In some examples, an external magnetic field source 204 is controlled by an automatic testing equipment (ATE) or other external control circuit. In some examples, testing and/or calibration and controlled by, and/or processing of resulting data is performed by, a processor external to the IC 202. In some examples, processing is performed by a central processing unit (CPU), digital signal processor (DSP), or a microcontroller unit (MCU).

In some examples, a control circuit 208 or other control circuit is a CPU, DSP, or MCU.

In some examples, processes described herein are controlled by hardware, software, or a combination thereof.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described examples, and other examples are possible within the scope of the claims.

What is claimed is:

1. An integrated circuit (IC) fabricated on a substrate that has a substrate surface, the IC comprising:

a magnetic concentrator;

a vertical Hall sensor configured to detect a magnetic field oriented in a first dimension parallel to the substrate surface, and located near the magnetic concentrator; and a trace, the trace having a first end, a second end, a first leg, and a second leg, the first leg and second leg each oriented in a second dimension that is perpendicular to the first dimension and is parallel to the substrate surface, the first leg coupled to the second leg in series between the first end and the second end, the first leg located near the magnetic concentrator and so that a line perpendicular to and intersecting the substrate surface and the magnetic concentrator intersects the first leg, and the second leg located near the vertical Hall sensor.

2. The IC of claim 1, wherein the first leg is a straight line and the second leg is a straight line; and wherein the first leg is parallel to the second leg.

3. The IC of claim 1, wherein the magnetic concentrator is a first magnetic concentrator;

wherein the trace includes a third leg;

the IC further including a second magnetic concentrator located so that the vertical Hall sensor and at least a portion of the second leg are between the first magnetic concentrator and the second magnetic concentrator; and wherein there is a line perpendicular to the substrate surface that intersects the second magnetic concentrator and the third leg.

4. The IC of claim 3, wherein a gap distance between the first magnetic concentrator and the second magnetic concentrator is approximately equal to a thickness of the first magnetic concentrator or a thickness of the second magnetic concentrator.

5. The IC of claim 3, wherein there is a line perpendicular to the substrate surface that intersects the vertical Hall sensor and the second leg.

6. The IC of claim 3, wherein there is a line perpendicular to the substrate surface that intersects the second leg and does not intersect the first magnetic concentrator; and wherein there is a line perpendicular to the substrate surface that intersects the second leg and does not intersect the second magnetic concentrator.

7. The IC of claim 3, wherein a portion of the trace that includes the first, second, and third legs is arranged to form either an S-shape or a W-shape.

8. The IC of claim 3, wherein the first, second, and third legs each have a first end and a second end, the second end of the first leg is coupled to the first end of the second leg via a first intermediate portion of the trace, and the second end of the second leg is coupled to the first end of the third leg via a second intermediate portion of the trace.

9. The IC of claim 3, wherein the first, second, and third legs each have a first end and a second end, the first end of the first leg is coupled to the first end of the second leg via a first intermediate portion of the trace, and the first end of the first leg is coupled to the first end of the third leg via a second intermediate portion of the trace.

10. The IC of claim 1, wherein the magnetic concentrator is shaped like a circle, an octagon, a star, an ellipse, or a rectangle.

11. A system comprising:

a magnetic concentrator;

a vertical Hall sensor configured to detect a magnetic field oriented in a first dimension parallel to a substrate surface, and located near the magnetic concentrator; and a trace, the trace having a first end, a second end, a first leg, and a second leg, the first leg and second leg each oriented in a second dimension that is perpendicular to the first dimension and is parallel to the substrate surface, the first leg coupled to the second leg in series between the first end and the second end, the first leg overlapping the magnetic concentrator, and the second leg overlapping the vertical Hall sensor.

12. The system of claim 11, wherein the first and second legs are located so that a current through the trace flows in a first direction through the first leg and in a second direction opposite the first direction through the second leg.

13. The system of claim 11, wherein the first leg is a straight line and the second leg is a straight line; and wherein the first leg is parallel to the second leg.

14. The system of claim 11, wherein the magnetic concentrator is a first magnetic concentrator;

wherein the trace includes a third leg;

the IC further including a second magnetic concentrator located so that the vertical Hall sensor and at least a portion of the second leg are between the first magnetic concentrator and the second magnetic concentrator; and wherein the second magnetic concentrator overlaps the third leg.

15. The system of claim 14, wherein a gap distance between the first magnetic concentrator and the second magnetic concentrator is approximately equal to a thickness of the first magnetic concentrator or a thickness of the second magnetic concentrator.

16. The system of claim 14, wherein the vertical Hall sensor at least partially overlaps the second leg;

wherein the second leg does not fully overlap the first magnetic concentrator; and wherein the second leg does not fully overlap the second magnetic concentrator.

17. The system of claim 14, wherein a portion of the trace that includes the first, second, and third legs is arranged to form either an S-shape or a W-shape.

18. The system of claim 14, wherein either:

the first, second, and third legs each have a first end and a second end, the second end of the first leg is coupled to the first end of the second leg via a first intermediate portion of the trace, and the second end of the second leg is coupled to the first end of the third leg via a second intermediate portion of the trace; or the first, second, and third legs each have a first end and a second end, the first end of the first leg is coupled to the first end of the second leg via a first intermediate portion of the trace, and the first end of the first leg is coupled to the first end of the third leg via a second intermediate portion of the trace.

19. The system of claim 11, further comprising:

a bias current source;

a voltage detector coupled to the vertical Hall sensor; and a control circuit configured to selectably couple the bias current source to the vertical Hall sensor.

20. The system of claim 19, further comprising:

a magnetic field source external to the substrate surface; and wherein the control circuit is configured to provide control signals so that in response:

the magnetic field source applies a magnetic field with a selected strength;

the voltage detector measures a first output voltage of the vertical Hall sensor responsive to the magnetic field source applying the magnetic field;

a selected current is provided to the trace; and the voltage detector measures a second output voltage of the vertical Hall sensor responsive to providing the selected current to the trace; and wherein the control circuit determines a correlation of the vertical Hall sensor between voltage and magnetic field strength, responsive to the first output voltage and the second output voltage.

* * * * *